United States Patent [19]
Rice

[11] B 3,992,717
[45] Nov. 16, 1976

[54] HOUSING FOR A COMPRESSION BONDED ENCAPSULATION OF A SEMICONDUCTOR DEVICE

[75] Inventor: Leslie R. Rice, Mansfield, Ohio

[73] Assignee: Westinghouse Electric Corporation, Pittsburgh, Pa.

[22] Filed: June 21, 1974

[21] Appl. No.: 481,930

[44] Published under the second Trial Voluntary Protest Program on February 24, 1976 as document No. B 481,930.

[52] U.S. Cl. .................................. 357/72; 357/74; 357/79; 174/52 R; 174/52 PE
[51] Int. Cl.² .................................. H01L 23/28
[58] Field of Search .................. 357/72, 73, 74, 79; 174/52 R, 52 S, 52 PE

[56] References Cited
UNITED STATES PATENTS

| | | |
|---|---|---|
| 3,450,962 | 6/1969 | Ferree et al. ........................ 357/79 |
| 3,499,095 | 3/1970 | Haus ..................................... 357/74 |
| 3,515,955 | 6/1970 | Butenschon ........................ 357/74 |
| 3,548,267 | 12/1970 | Siddell ................................. 357/74 |
| 3,559,001 | 1/1971 | Cooper et al. ....................... 357/79 |
| 3,597,524 | 8/1971 | Schreiner ............................. 357/79 |
| 3,686,542 | 8/1972 | Rindner et al. ..................... 357/79 |
| 3,721,867 | 3/1973 | Schierz ................................ 357/79 |
| 3,837,000 | 9/1974 | Platzoeder et al. ................. 357/79 |

*Primary Examiner*—Andrew J. James
*Attorney, Agent, or Firm*—C. L. Menzemer

[57] ABSTRACT

An assembly comprising a metal-semiconductor-metal element, an insulating sleeve member disposed about the metal-semiconductor-metal element and a metal pole piece contact. The three elements together form a disc-shaped power semiconductor device assembly for operation in a compression bonded application.

3 Claims, 2 Drawing Figures

HOUSING FOR A COMPRESSION BONDED ENCAPSULATION OF A SEMICONDUCTOR DEVICE

BACKGROUND OF THE INVENTION

1. Field of the Invention

The present invention relates to encased assemblies comprising semiconductor devices, and more particularly to high power semiconductor rectifiers and thyristors.

2. Description of the Prior Art

Disc-type assembly of power semiconductor devices is generally known in the art. The purpose of such disc-type assembly is to encapsulate the basic semiconductor element. The basic semiconductor element typically consists of a silicon wafer soldered to a molybdenum base or a three piece molybdenum-silicon-molybdenum sandwich. The state of the art is to encapsulate the semiconductor element in a ceramic case which consists of at least two major members. One member of the case being a metal contact or pole piece brazed to a ceramic cylinder forming a cup-shaped housing in which the basic semiconductor element is placed. Another member of the case comprises a metal contact or pole piece to be applied to the other side of the semiconductor element. Both members of the case having outwardly extending weld flanges at the periphery. Encapsulation is achieved by mounting the semiconductor element on the pole piece within the ceramic housing, then covering the element with the other pole piece and welding the two flanges together.

Recent developments in the art have brought about cost reduced versions of the expensive ceramic to metal weld-type assemblies. Such an improvement is set forth in U.S. Pat. No. 3,443,168 relating to resin encapsulated, compression bonded, disc-type semiconductor device assemblies. The present invention discloses an improvement upon the invention of U.S. Pat. No. 3,443,168.

SUMMARY OF THE INVENTION

Briefly the present invention comprises a unitary semiconductor device comprising a bonded metal-semiconductor-metal element, which is generally referred to as a fusion element. The fusion element has an insulating and protective coating disposed upon and completely covering the exposed edge of the semiconductor wafer. The fusion element is surrounded by a preformed insulating sleeve. A deposit of elastomeric material unites the fusion element to the insulating sleeve member. The metal electrode contacts on each side of the fusion element provide electrical contacts to the semiconductor wafer. The bottom electrode contact of the fusion element is sealed to the inside wall of the insulating sleeve member. A pole piece contact is sealed to the upper end of the insulating sleeve member and extends into the aperture of the insulating sleeve member to make contact with the top electrode contact of the fusion element.

The assembly of this invention offers two basic advantages over the prior art. It provides a low cost technique for encapsulating the basic fusion element and eliminates one of the two pole piece contacts typically used in similar devices of the prior art. The fact that the assembly of this invention uses only one pole piece contact permits the direct heat sinking of one side of the fusion element. This substantially reduces thermal impedance in relationship to devices of the prior art which results in higher power capacity.

One of the cost advantages accomplished by this invention is the simplicity of hermetically protecting the fusion element. Devices of the prior art attempt to achieve hermeticity with various encapsulation systems such as welding, injection molding, compression O-ring seals, adhesive bonding techniques or some combination of the above. The purpose of the hermetic seal used in the prior art is to provide a stable environment to the coated junction area. Any particles trapped inside the device may collect on the coating and have deleterious results. An advantage of this invention is that a totally hermetic seal is unnecessary since the coating area is protected by the deposit of elastomeric material. The internal space between the inside wall of the insulating sleeve member and the fusion element is filled with the deposit of elastomeric material, thus the coated junction area is environmentally protected prior to sealing the insulating sleeve member to the pole piece contact.

DESCRIPTION OF THE PREFERRED EMBODIMENTS

Figure 1:
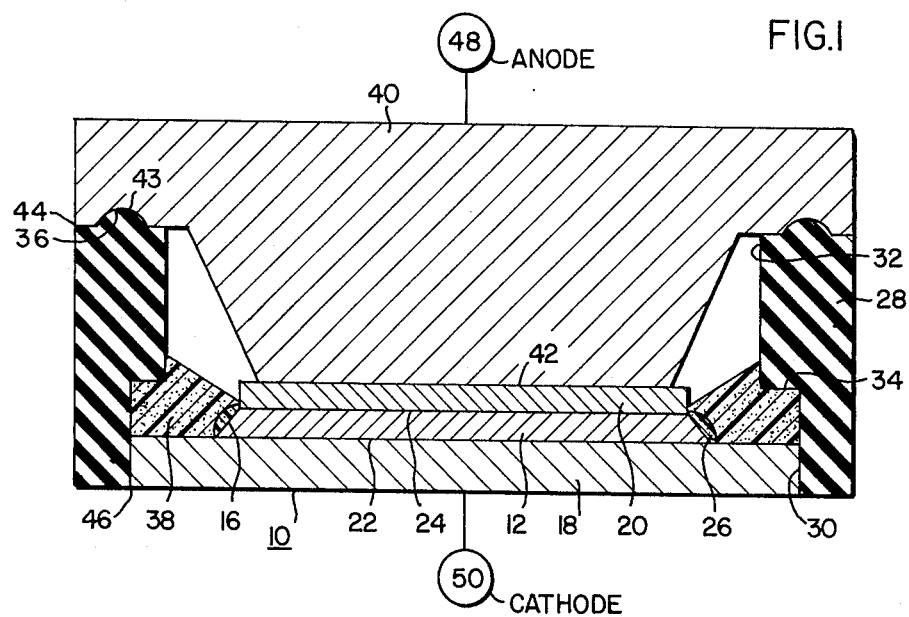
FIG. 1 is a vertical cross sectional view of an assembly of this invention using a rectifier fusion element.

Throughout the description which follows, like reference characters refer to like parts in all Figures of the drawing.

FIG. 1 illustrates the semiconductor device assembly disclosed by this invention. The semiconductor device assembly illustrated comprise a basic semiconductor fusion element 10. The fusion element 10 is produced by techniques known in the art. The basic fusion element 10 consists of a semiconductor wafer 12 having the appropriate electrical characteristics, and two disc-shaped refractory metal electrode contacts 18 and 20. Suitable refractory metals are molybdenum or tungsten. Suitable semiconductor materials are silicon or germanium or one of the so-called "III-V valence compounds" such as Gallium Arsenide. The metal electrode contacts 18 and 20 are fused to the opposite sides of the semiconductor wafer 12 by soldering or brazing at interfaces 22 and 24. Preferably one of the metal electrode contacts 18 is larger than the semiconductor wafer 12 and the other metal electrode contact 20 is co-extensive to the surface of semiconductor wafer 12 to which it is affixed. The periphery of the semiconductor wafer 12 is beveled as shown at 16. An insulating and protective junction coating material 26 is applied to the exposed beveled edge 16 of the semiconductor wafer 12. The coating composition and manner of application is well known in the art. A high temperature curing silicone varnish is a suitable coating material. The fusion element 10 has known stable electrical characteristics at this stage of production; however, it is generally not used in commercial practice in this condition, since its electrical characteristics can be adversely affected by dirty or humid environments. Therefore, in order to protect the fusion element 10 from such adverse environments, it is usually encapsulated or enclosed in a housing. In the practice of this invention the encapsulation or housing for the element 10 consists of a cylindrical preformed insulating sleeve member 28 and a top pole piece contact 40. The pole piece contact 40 may be aluminum or copper or other suitable metal. If copper is used, it is advisable to plate the pole piece contact 40 with nickel so that copper oxide will not form at electrical interfaces. The insulating sleeve member 28 may be preformed or molded from silicone rubber, polyurethane resins or other suitable material since a moderately flexible insulating material is preferred for the member 28. The member 28 has an internal step or shelf 34 providing two cylindrical internal walls of different diameters. The larger internal diameter 30 at the lower end of the member 28 fits around the larger bottom electrode contact 18 of the fusion element 10. An upper smaller internal diameter 32 provides a thicker wall and a wider mating surface at its upper end where it is sealed to the pole piece contact 40. The shelf 34 provides an additional bearing surface for the deposit of elastomeric material 38. The deposit of elastomeric material 38 may consist of a room temperature vulcanizing silicone rubber, an example of which is commercially available as Dow Corning 3141 RTV coating. The deposit of elastomeric material 38 is disposed in the cavity created by the inside surfaces of the insulating sleeve member 28 and the fusion element 10 in a manner such that the junction coating material 26 is completely covered by the deposit of elastomeric material 38 while the upper contact surface 42 of the fusion element 10 remains exposed. The pole piece contact 40 has an outside diameter approximately equal to the outside diameter of the insulating sleeve member 28 while the bottom or internal portion of the pole piece contact 40 is a frusto conical-shaped projection which extends into the aperture of the insulating sleeve member 28 and makes contact with the fusion element 10 at surface 42.

Between the top cylindrical-shaped portion of the pole piece contact 40 and the bottom frusto conical-shaped portion there is an interface 44 which mates with the insulating sleeve member 28. There is an O-ring type protection 36 on the upper surface of the insulating sleeve member 28 which is inserted into a mating depression 43 on the pole piece contact 40 at the interface 44. An adhesive is used for convenience to hold the semiconductor device assembly together at the upper interface 44 just described; and, also at the lower interface 46 between the insulating sleeve member 28 and the fusion element 10. The bottom surface of the fusion element 10 provides the external connection 50 (for example cathode) to the semiconductor device assembly. Similarly the top surface of the pole piece contact 40 provides another external connection 48 (for example anode). These surfaces provide both electrical and thermal external contacts.

Figure 2:
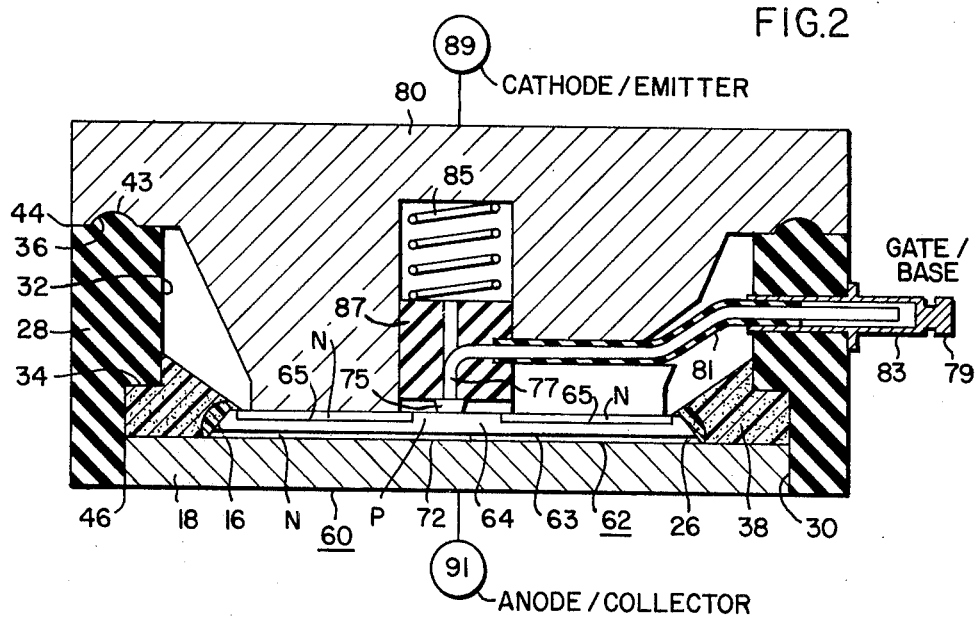
FIG. 2 is a vertical cross section view of an assembly of this invention using a thyristor fusion element.

FIG. 2 illustrates the semiconductor device assembly disclosed by this invention using a three pole fusion element as, for example, a semiconductor transistor fusion element 60 rather than the semiconductor rectifier fusion element 10 described in FIG. 1. The transistor fusion element 60 comprises semiconductor wafer 62, metal electrode contact 18 and junction coating material 26 assembled in similar fashion to the rectifier fusion element 10 of FIG. 1. The wafer 62 comprises, for example, an N-type collector region 63, a P-type base region 64 and an N-type emitter region 65. The embodiment of FIG. 2 is also suited for use with a thyristor fusion element rather than the transistor fusion element shown, in which case an additional P-type region would lie below the N-type region 63 of the wafer 62 adjoining the contact 18 at interface 72. The embodiment of FIG. 2 is similar in function to the embodiment of FIG. 1 with the addition of a gate or base contact assembly system necessary to activate a thyristor or transistor element respectively. The contact assembly system comprises a pressure contact 75 which is connected to an internal lead 77 which extends into a cylindrical aperture of an external contact tab 79. The internal lead 77 is insulated from the pole piece contact 80 by means of a polytetrafluoroethylene insulating sleeve 81, commercially available under the trademark Teflon. Electrical contact between the internal lead 77 and the external contact tab 79 is achieved by crimping the external contact tab 79 at point 83. The necessary electrically contacting pressure is supplied by a spring member 85 which forces an insulating locater 87 down upon the pressure contact 75 causing the pressure contact 75 to make good electrical contact with the appropriate region 64 of the semiconductor element 60. Similarly, as described above with respect to the rectifier embodiment of FIG. 1, the thyristor or transistor embodiment of FIG. 2 has two major external contact surfaces 89 and 91 for electrical and thermal contacts, for example, cathode and anode in the case of thyristor or emitter and collector in the case of a transistor.

From the foregoing description, taken with the drawings, it is seen that this invention provides a simple, economical, and effective assembly for protecting the semiconductor fusion element of a semiconductor rectifier thyristor or transistor device. While rectifiers, thyristors and transistors have been referred to due to their popularity, other types of devices are equally capable of the construction of this invention.

What is claimed is:

1. A semiconductor device, said semiconductor device comprising:

a. a fusion element, said fusion element comprising a wafer of semiconductor material, said wafer having top and bottom major opposed flat parallel surfaces, an upper metal electrode affixed to said top surface of said wafer, a lower metal electrode affixed to said bottom surface of said wafer, siad lower metal electrode being cylindrical in shape with flat top and bottom surfaces and extending beyond the periphery of said wafer of semiconductor material to which it is affixed, means coating and protecting the edge of said wafer of semiconductor material;

b. a flexible electrical insulating sleeve member having at least one cylindrical shaped inside wall elastically held against the cylindrical shaped edge of said lower electrode, said sleeve member extending from a point above said upper metal electrode to a point flush with said bottom surface of said lower metal electrode;

c. an elastomeric material disposed in the cavity formed by the inside wall of the insulating sleeve member and the edges of the fusion element;

d. a metal pole piece contact adjoined to the upper end of the sleeve member and having a projection extending into the sleeve and making electrical contact with the fusion element.

2. A semiconductor device as set forth in claim 1 wherein the insulating sleeve member has a projection at its interface with the pole piece contact, said pole piece contact having a depression therein, said projection on said insulating sleeve extending into said depression in said pole piece contact to form a seal between said insulating sleeve and said pole piece contact.

3. A semiconductor device assembly as set forth in claim 1 wherein said semiconductor device comprises a three pole fusion element, said fusion element having a base region in the wafer of semiconductor material, means making electrical contact with said base region, electrical conductor means connected to said means making electrical contact with said base region, said electrical conductor means extending through a wall of said insulating sleeve.

* * * * *